(12) United States Patent
Tatem

(10) Patent No.: US 9,729,935 B1
(45) Date of Patent: Aug. 8, 2017

(54) SWITCHING SPLITTER AND METHOD OF OPERATING THE SAME

(71) Applicant: The DIRECTV Group, Inc., El Segundo, CA (US)

(72) Inventor: Richard B. Tatem, Middletown, MD (US)

(73) Assignee: The DIRECTV Group, Inc., El Segundo, CA (US)

( * ) Notice: Subject to any disclaimer, the term of this patent is extended or adjusted under 35 U.S.C. 154(b) by 3 days.

(21) Appl. No.: 14/635,767

(22) Filed: Mar. 2, 2015

(51) Int. Cl.
| | | |
|---|---|---|
| H03K 17/68 | (2006.01) |
| H03K 17/693 | (2006.01) |
| H04N 21/61 | (2011.01) |
| H04N 21/41 | (2011.01) |
| H01H 47/00 | (2006.01) |

(52) U.S. Cl.
CPC ........ H04N 21/6143 (2013.01); H01H 47/00 (2013.01); H03K 17/68 (2013.01); H03K 17/693 (2013.01); H04N 21/41 (2013.01)

(58) Field of Classification Search
CPC .. H03K 17/693; H03K 17/007; H03K 17/063; H03K 17/16; H03K 17/56; H03K 17/6877; H03K 2017/066; H03K 2217/0054; H04L 5/1461; H04L 12/2838; H04N 7/104; H04N 21/6142; H04N 21/41; H04B 1/006; H04B 1/48
See application file for complete search history.

(56) References Cited

U.S. PATENT DOCUMENTS

| | | |
|---|---|---|
| 4,518,993 A | 5/1985 | Okada et al. |
| 4,675,732 A | 6/1987 | Oleson |
| 5,029,232 A | 7/1991 | Nall |
| 5,303,295 A | 4/1994 | West et al. |
| 5,461,427 A | 10/1995 | Duffield et al. |
| 5,787,335 A | 7/1998 | Novak |
| 5,959,592 A | 9/1999 | Petruzzelli |
| 6,023,603 A | 2/2000 | Matsubara |
| 6,434,747 B1 | 8/2002 | Khoo et al. |
| 6,622,307 B1 | 9/2003 | Ho |

(Continued)

FOREIGN PATENT DOCUMENTS

| | | |
|---|---|---|
| EP | 0534278 A1 | 3/1993 |
| WO | 2008118458 A1 | 10/2008 |

OTHER PUBLICATIONS

SatPro.tv; "8 Way DIRECTV Zinwell Multiswitch HD 6×8 (WB68) or the (MS6X8WB-Z)"; Nov. 1, 2009; XP002718572; retrieved from the Internet: URL:http://www.satprotv.ms6×8wb-z.aspx; [retrieved on Jan. 10, 2014].

(Continued)

Primary Examiner — Hai V Tran
(74) Attorney, Agent, or Firm — Harness, Dickey & Pierce, PLC

(57) ABSTRACT

A switching splitter and method of operating the same comprises a first port, a second port in communication with the first port and a third port in communication with the first port. A switching module is in communication with the second port and the third port. The switching module switches in response to a direct current voltage at the second port. The switching module communicates a control signal from the second port to the first port or from the third port to the first port in response the direct current voltage.

10 Claims, 12 Drawing Sheets

(56) References Cited

U.S. PATENT DOCUMENTS

| | | |
|---|---|---|
| 6,804,828 B1 | 10/2004 | Shibata |
| 6,810,413 B1 | 10/2004 | Rajakarunanayake et al. |
| 6,922,844 B1 | 7/2005 | Arsenault et al. |
| 7,039,937 B1 | 5/2006 | Glenn |
| 7,043,750 B2 | 5/2006 | Ina |
| 7,240,357 B1 | 7/2007 | Arsenault et al. |
| 7,917,931 B2 | 3/2011 | Bertonis et al. |
| 8,082,570 B2 | 12/2011 | Olson et al. |
| 8,280,326 B2 | 10/2012 | Fenkes et al. |
| 8,350,641 B2 * | 1/2013 | Alkan ................ H04L 12/2838 333/126 |
| 8,510,782 B2 | 8/2013 | Wells et al. |
| 8,726,320 B1 | 5/2014 | Tatem et al. |
| 2001/0037512 A1 | 11/2001 | Fickner et al. |
| 2003/0129960 A1 | 7/2003 | Kato et al. |
| 2004/0107445 A1 | 6/2004 | Amit |
| 2005/0107052 A1 | 5/2005 | Zangerl |
| 2011/0151769 A1 | 6/2011 | Fitzpatrick |
| 2013/0176074 A1 * | 7/2013 | Chih-Sheng ......... H03K 17/693 327/530 |
| 2013/0182190 A1 | 7/2013 | Mccartney |
| 2014/0049312 A1 * | 2/2014 | Chih-Sheng ......... H03K 17/693 327/427 |
| 2014/0130107 A1 * | 5/2014 | Tatem ................... H04H 20/63 725/81 |
| 2015/0358015 A1 * | 12/2015 | Bawell ..................... H01P 1/22 327/384 |

OTHER PUBLICATIONS

Geekzone; "Multiple STB Advice"; Sep. 2, 2008; XP002718586; retrieved from the Internet: URL:http://www.geekzone.co.nz/forums.asp?forumid=83&topicid=40568; [retrieved on Jan. 13, 2014]; responses #251978, 252598, 252601.

SatPro.tv; "Holland 2-way Splitter All Port Power 15-2150 MHz W/Diode (HFS-2D)"; Dec. 9, 2011; XP002718571; retrieved from the Internet: URL:http://www.satpro.tv/hfs-2d.aspx; [retrieved on Jan. 13, 2014].

* cited by examiner

SWITCHING SPLITTER AND METHOD OF OPERATING THE SAME

TECHNICAL FIELD

The present disclosure relates generally to satellite television receiving device, and, more specifically, to a bracket for mounting the devices on or near a display or television.

BACKGROUND

The statements in this section merely provide background information related to the present disclosure and may not constitute prior art.

To facilitate satellite broadcast service for a residential subscriber, a satellite service provider installs one or more "satellite dish" antennas at the subscriber's residence. The satellite dish is positioned to provide an unobstructed line-of-sight (LOS) with the satellite service provider's satellite(s) for signal reception. For rural or suburban single-family residences, the satellite dish will commonly be placed on the roof, attached to an exterior wall with appropriate (e.g., southern) exposure, or mounted on a pole in the yard, as long as line of sight with the satellite is not obstructed by trees, mountains or other structures.

For potential subscribers in more urban, higher-density housing environments, such as "multi-dwelling units" (MDU) in which individual housing units for residents or tenants are contained within one building or several buildings within one complex (e.g., apartments, condominiums, office suites, commercial and hotels), the provision of individual satellite dishes to each subscriber may be impractical or even prohibited. Not all residents of multi-dwelling units have an exterior wall or balcony with appropriate exposure, and those that do may be blocked by adjacent structures. Additionally, building codes and community rules (e.g., condominium association rules) may restrict the use of satellite dishes.

To address these issues, satellite service providers may install local content distribution systems within hotels and large multi-dwelling units to service multiple units/subscribers from a single satellite dish resource. A common dish may be used for multiple units/subscribers. Various electrical components are used to distribute the signals to the individual units/subscribers. Reducing the time and reducing the number of service personnel used to install and service an item is desirable

SUMMARY

The present disclosure provides a switching splitter that communicates control signals in a manner to prevent interference of multiple control signals.

In one aspect of the disclosure, a switching splitter comprises a first port, a second port in communication with the first port and a third port in communication with the first port. A switching module is in communication with the second port and the third port. The switching module switching in response to a direct current voltage at the second port. The switching module communicates a control signal from the second port to the first port or from the third port to the first port in response to the direct voltage.

In another aspect of the disclosure, a method of operating a switching splitter module comprising a first port, a second port in communication with the first port and a third port in communication with the first port is set forth. The method comprises in response to a direct current voltage at the second port, controlling a switch module; and communicating the control signal from one of the second port to the first port or from the third port to the first port in response to controlling.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
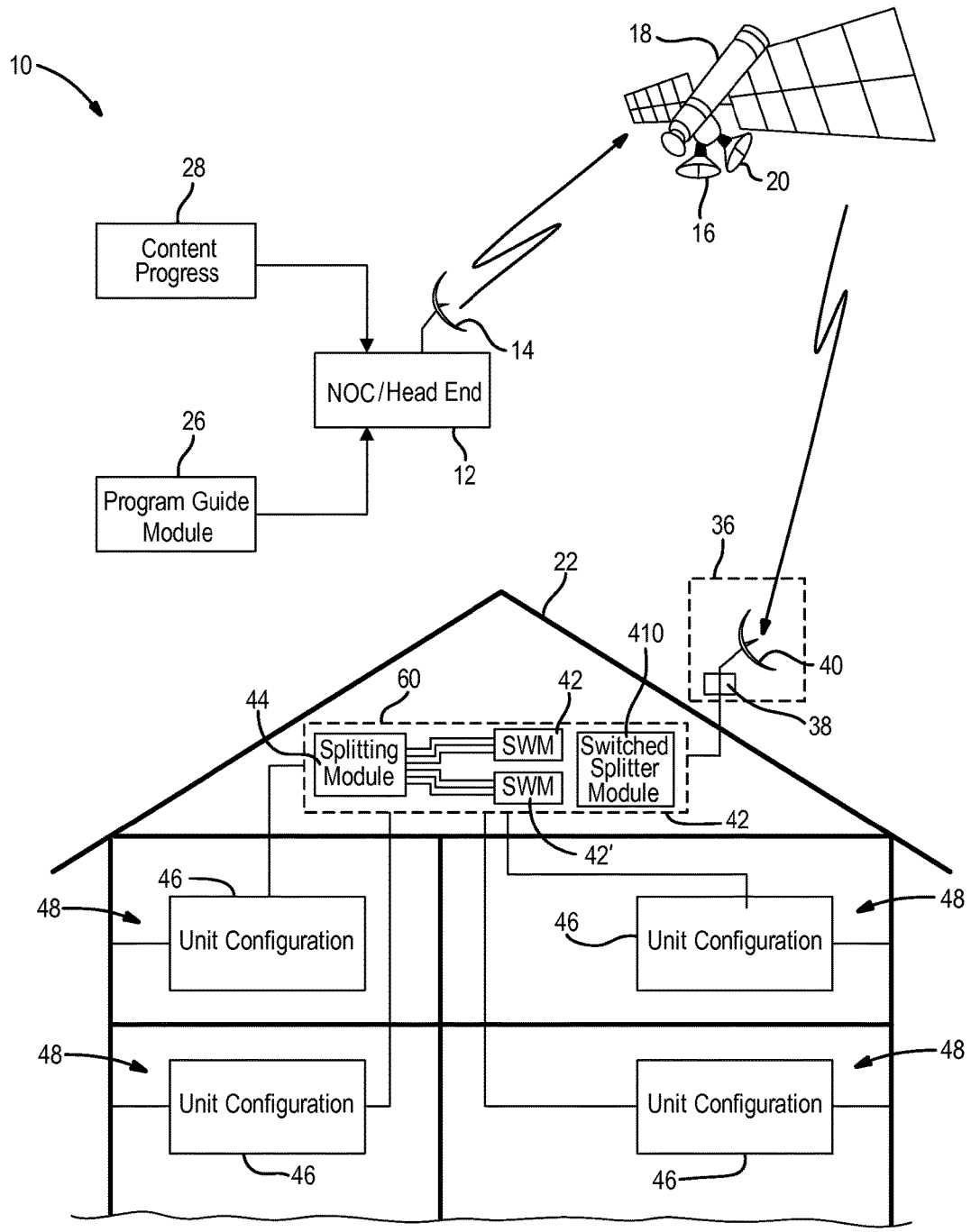
FIG. 1 is a high level block diagrammatic view of a content distribution such as a satellite television broadcasting system.

The following description is merely exemplary in nature and is not intended to limit the present disclosure, application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical OR. It should be understood that steps within a method may be executed in different order without altering the principles of the present disclosure.

Referring now to FIG. 1, a satellite television distribution system 10 is shown for broadcasting television signals. The satellite television distribution system 10 includes an operational headend or network operations center (NOC) 12 that generates wireless uplink signals through a transmitting antenna 14 which are received by a receiving antenna 16 of a satellite 18. The wireless signals, for example, may be digital and in a first format used for satellite communications. A transmitting antenna 20 generates wireless downlink signals directed to various receiving systems including stationary systems such as those in a building 22 or property with multiple buildings. The building 22 may be a multiple dwelling unit (MDU) with individual unit configurations.

The wireless signals may have various types of data associated with them including various channel information such as a channel or program guide, metadata, location information and the like. The guide data may be received from the network operations center 12 or external headend. The wireless signals may also have various video and audio signals associated therewith.

The program guide data may be received from a program guide module 26. The program guide module 26 may communicate various objects to the network operations center 12. Various types of data may be communicated about the programming and grid guide including the channel number, a network identifier, program data such as a start and end time of airing, title, numerical identifier, content data such as actors, descriptions, ratings and the like. Program guide data may include the relative positions of the data, the line structures for forming the grid for the program guide and the like.

A content provider 28 may provide content to the network operations center 12. The content provider 28 may include various television networks that provide programming and content for a particular channel as well as on-demand and pay-per-view providers that provide content for communication at particular times over channels specified at the network operations center 12.

Building 22 includes an outdoor unit 36 that includes a control circuit 38 and a receiving antenna (e.g., satellite dish) 40 that receives the wireless signals from the satellite 18. The control circuit 38 controls the signals from the satellite antenna 40. A plurality of low noise blocks may be included within the antennas 48a, 48b. The control circuit 38 controls the communication of the signals to a single-wire multi-wire switch (SWM) module 42. Although only one antenna 40 is illustrated, more antennas may be provided. The control circuit 38 may include a low noise block that tunes to the appropriate satellite and frequencies.

As will be described below, more than one single-wire multi-switch may be included within a system. The single-wire multi-switch module 42 is used to multiplex signals on one or more outputs. In some examples, the multiplexed output signals may have frequencies designated for use by particular user receiving device tuners within building 22.

The control signals from the SWM module 42 may include a direct current (DC) voltage signal and an alternating current (AC) control signal. The AC control signal may be sinusoidal, square, saw-tooth or a variety of shapes. In one constructed example, an 18 volt control signal controls the communication of signals from the 101 and 99 orbital slots. Another signal less than 14 volts, such as 13 volts, controls the right hand polarization signals from the 101 orbital slot. An 18 volt signal together with a 22 kHz signal may control the output from the 110 and 119 orbital slot left hand polarized transponders of the 110 and 119 orbital slots. A 13 volt control signal along with a 22 kHz AC control signal may control the passing of signals from the right hand polarized 110 and 119 orbital slots.

A splitting module 44 is in communication with the single-wire multi-switch module 42. The splitting module 44 may split the channel signals for distribution to various unit configurations 46. Each unit configuration 46 corresponds to a user receiving device configuration within each of the individual units 48 within the building 22. The splitting module 44 and unit configuration 46 are described further below. By way of example, four individual units 48 are illustrated, each having a respective unit configuration 46.

An enclosure 60 may be used to enclose various television distribution components. Also, various connectors or openings for connecting or receiving wires for electronically connecting the antennas to the electrical components and for electrically connecting the electrical components to the unit configurations may be provided at the enclosure 60. The enclosure 60 may be mounted in various locations on the building 22. Details of the enclosure 60 are set forth below.

Figure 2:
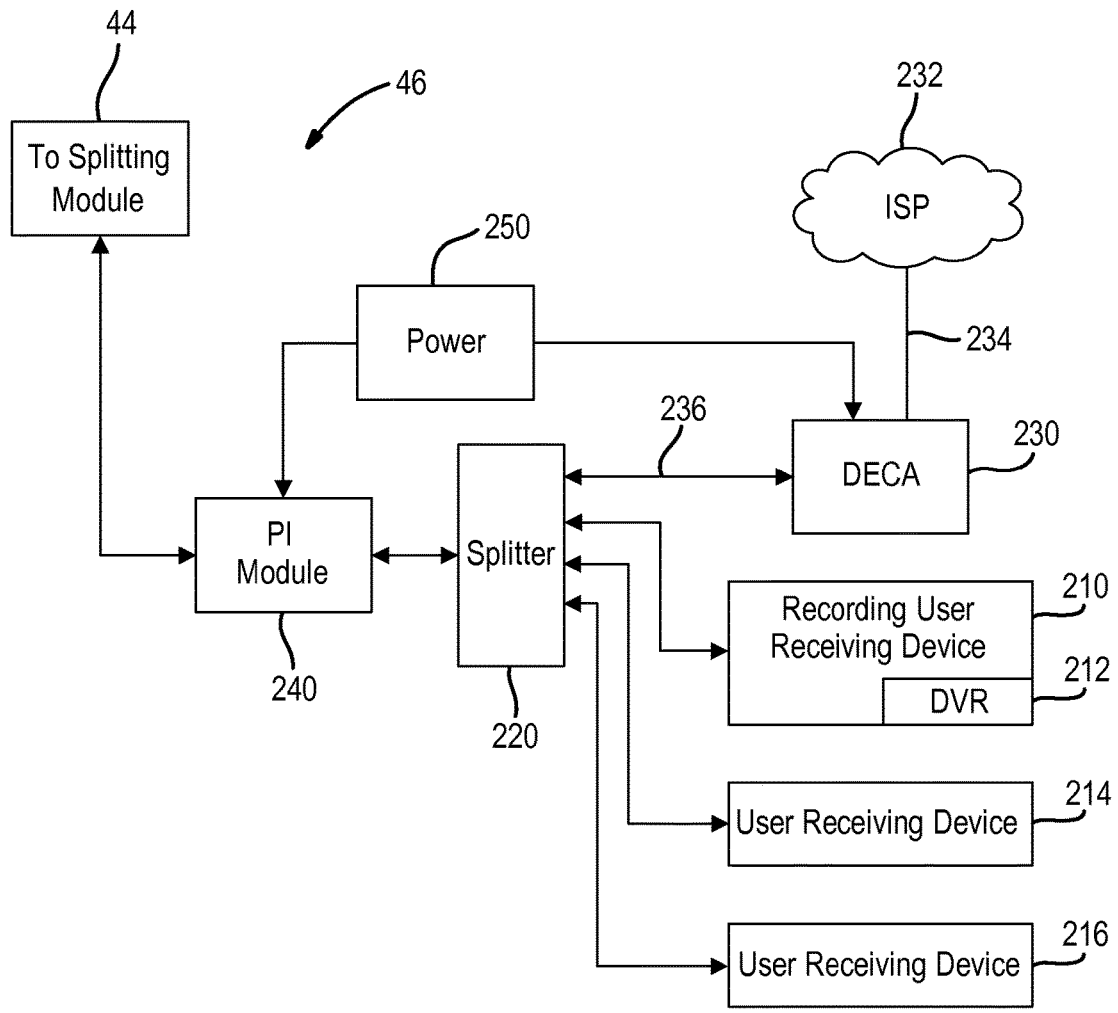
FIG. 2 is a block diagrammatic view of the unit configuration of FIG. 1.

Referring now to FIG. 2, one example for a unit configuration 46 is set forth. As will be described further below, various numbers of user receiving devices may be used. In this example, a first user receiving device is a recording user receiver device 210. A digital video recorder is provided as an example of a memory used for recording content. The digital video recorder 212 may comprise a hard drive or other types of chip-based memory such as FLASH memory. The user receiving device 210 may be used for receiving satellite signals or terrestrial over the air signals. Further, the user receiving device 210 may be used for receiving cable television signals. Of course, it should be noted that various numbers of recording user receiving devices 210 and user receiving devices 214, 216 may be used in a particular configuration. Each of the recording user devices 210 and the user receiving devices 214, 216 are in communication with a splitter 220. The splitter 220 ultimately receives signals from the splitting module 44.

A DIRECTV® Ethernet Coaxial Adapter (DECA) 230 may be in communication with an internet service provider 232 and the splitter 220. Between the ISP 232 and DECA a category 5 cable 234 may be used. Of course, often suitable IP cables may be used. The DECA 230 is used to convert the internet service provider signals into a coaxial format for communication to the splitter 220 through a coaxial cable 236. The coaxial cable may be RG6 or RG11 depending on the distance. Longer distances may require RG11. The splitter 220 may distribute the internet signals to the recording user receiving device 210 and the user receiving devices 214, 216. Likewise, signals from the recording user receiving device 210 and the user receiving devices 214, 216 may be communicated to the splitter 220 and ultimately to the internet service provider 232 through the DECA 230.

A power injection (PI) module 240 may be used to inject power onto the cable from the splitting module 44. A relatively low power such as 29 watts may be provided to the splitting module 44. Both channel signals and power may thus occupy the same cable.

Both the DECA 230 and the PI module 240 require power from a power source 250. Although not illustrated, the recording user receiving device 210, the user receiving device 214 and the user receiving device 216 all require power.

The cable connections between the splitter 228 and the user receiving devices 210, 214, 216 and the splitter 220 and the splitting module 44 may all be coaxial cable.

Figure 3:
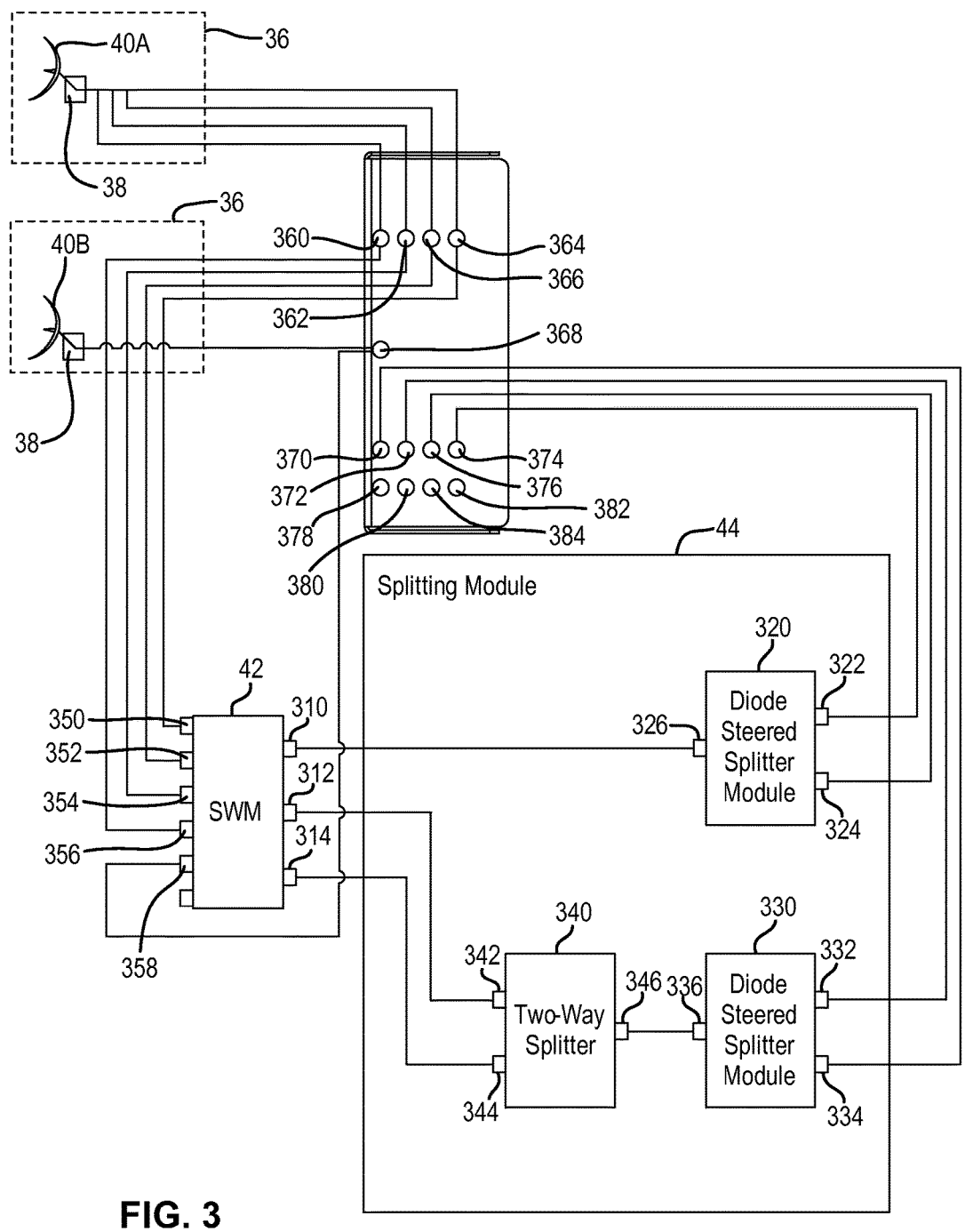
FIG. 3 is a block diagrammatic view of a first example of a splitting module according to FIG. 1.

Referring now to the FIG. 3, a first example of a splitting module 44 is set forth relative to a side wall 308 of the enclosure. The single-wire multi-switch module 42 includes a first port 310 that is capable of transmitting multiplexed channel signals therethrough. The first port 310 is also capable of receiving input power to power the single-wire multi-switch module 42. Ultimately the power into port 310 may originate from one PI module 240 from one unit configuration 46 as is illustrated in FIG. 2.

The second port 312 of the single-wire multi-switch module 42 is used for receiving power. In this example the second port 312 is a dedicated power input port.

The single-wire multi-switch module 42 may also include a third port 314. The third port 314 is a dedicated channel output port. A plurality of channels may be multiplexed onto the same wire extending from the output port 314.

The splitting module 44 may include a first diode steered splitter module 320. The first diode steered splitter module 320 may include a fourth port 322 that is in communication with a first multi-dwelling unit. In particular, the fourth port 322 may be in communication with the PI module 240 located in the first multi-dwelling unit illustrated in FIG. 2.

The diode steered splitter module 320 may also include a fifth port 324 that is in communication with a second multi-dwelling unit. In particular, the fifth port 324 may be in communication with a second PI module 240 located in a second multi-dwelling unit.

The diode steered splitter module 320 also includes a fourth port 326 that is in communication with the first port 310 of the single-wire multi-switch 42. Port 326 may receive multiplexed channel signals from the first port 310. The diode steered splitter module 320 may communicate the multiplexed channel signals from the sixth port 326 to the fourth and fifth ports 322, 324. Likewise, power from the PI modules 240 located in different multi-dwelling units may communicate power to the sixth port 326. A description of the power communication is described below. Generally, the port 322 or 324 having the highest voltage provides the output through the sixth port 326.

A second diode steered splitter module 330 is configured in similar manner to the diode steered splitter module 320 described above. In this example a seventh port 332 and an eighth port 334 are in communication with PI modules 240 located in a third and fourth multi-dwelling unit. A ninth port 336 is in communication with a two-way splitter 340. In particular, a tenth port 346 of the two-way splitter is in communication with the ninth port 336. An eleventh port 342 is in communication with the second port 312 of the single-wire multi-switch. A twelfth port 344 is in communication with the third port 314 of the single-wire multi-switch 42. The two-way splitter 340 splits the signal from the tenth port 346. In reverse, the two-way splitter 340 combines the signals from the eleventh port 342 and the twelfth port 344 at the tenth port 346.

In this manner, when a power signal is selected at the diode steered splitter module 330, the eleventh port 342 provides power to the dedicated power port 312. In the reverse direction multiplexed channel signals from the third port 314 are combined with the power signal from the eleventh port 342.

The enclosure 60 described above may include the single-wire multi-switch module 42 and the splitting module 44. The single-wire multi-switch module 42 may include a plurality of inputs 350, 352, 354, 356 and 358. The inputs 350, 358 may be connected to the antennas 40A, 40B. Antennas 40A, 40B are shown rather than a single antenna 40 as was illustrated in FIG. 1. Antennas 40A and 40B are shown to illustrate that more than one antenna may be used to communicate with different satellites. In a typical DIRECTV system, one antenna 40A may be used to communicate with five satellites. However, the additional antenna 40B may be used to communicate international content from a separate satellite. Connectors 360, 362, 364, 366 and 368 may interconnect the satellite antennas with the SWM module 42.

The outputs of the diode steered splitter modules 320, 330, 320', 330' are coupled to the outputs 370, 372, 374 and 376. Other outputs used in the figure below are 378, 380, 382 and 384. The outputs 370-384 may represent openings in a wall or connectors. The connectors may be integrated with the ports 322-334 and extend through the openings. The outputs 370-384 are outputs to individual customer premises.

Figure 4:
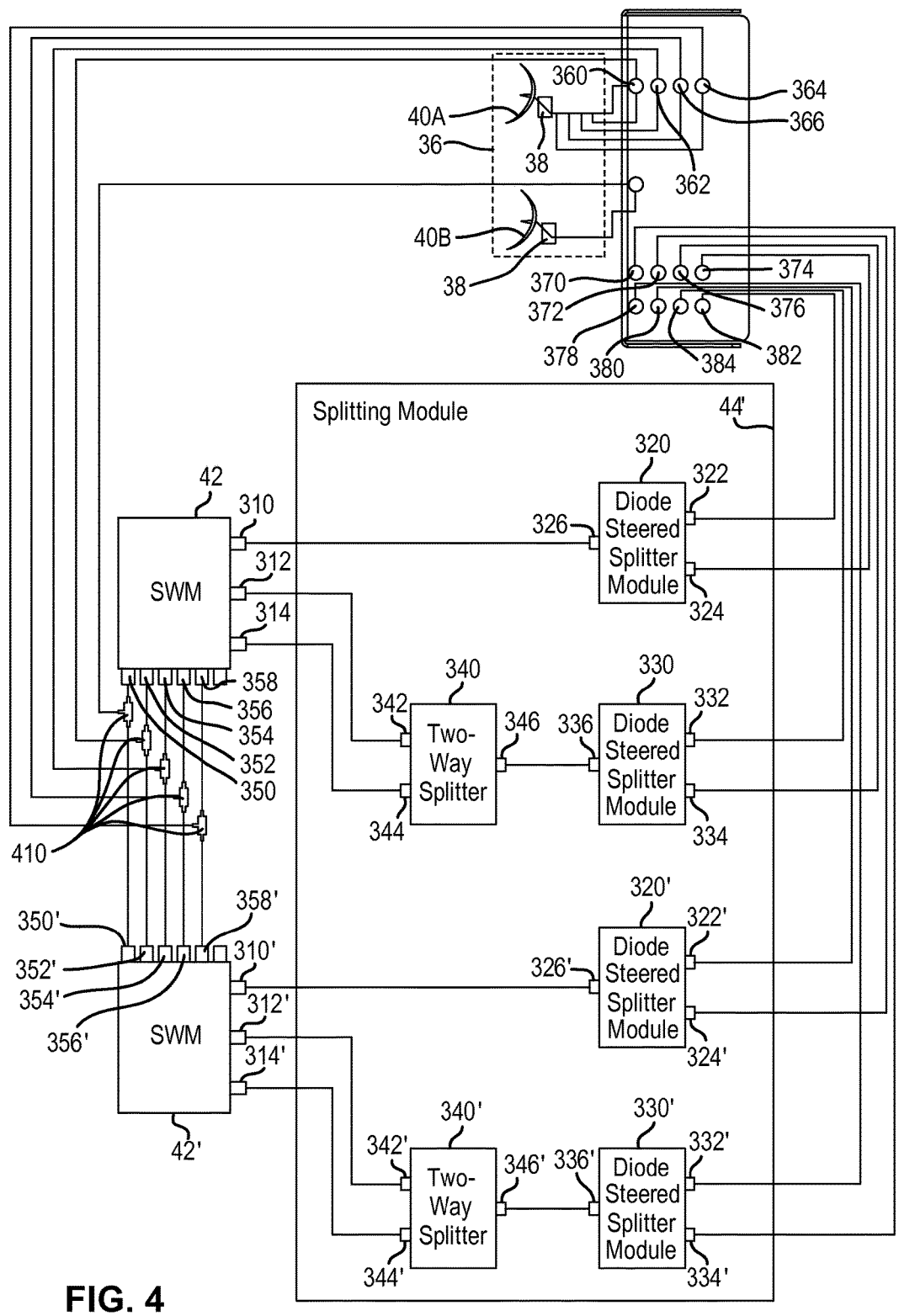
FIG. 4 is a block diagrammatic view of a second example of the splitting module of FIG. 1.

Referring now to FIG. 4, a splitting module 44' suitable for a larger multi-dwelling unit as set forth. In this example the splitting module configuration is duplicated twice so that eight outputs are formed. The same reference numbers are used for the same components as those of FIG. 3. The lower half of the figure is labeled with primed reference numerals. In addition to the above, switching splitters 410 are used to split the satellite signals received through the antennas 40A, 40B. The switching splitters 410 split each signal and are used for joining a first group of ports 350-358 on the first SWM module 42 with the second group of ports 350'-358' on respective SWM modules 42'.

Figure 7A:
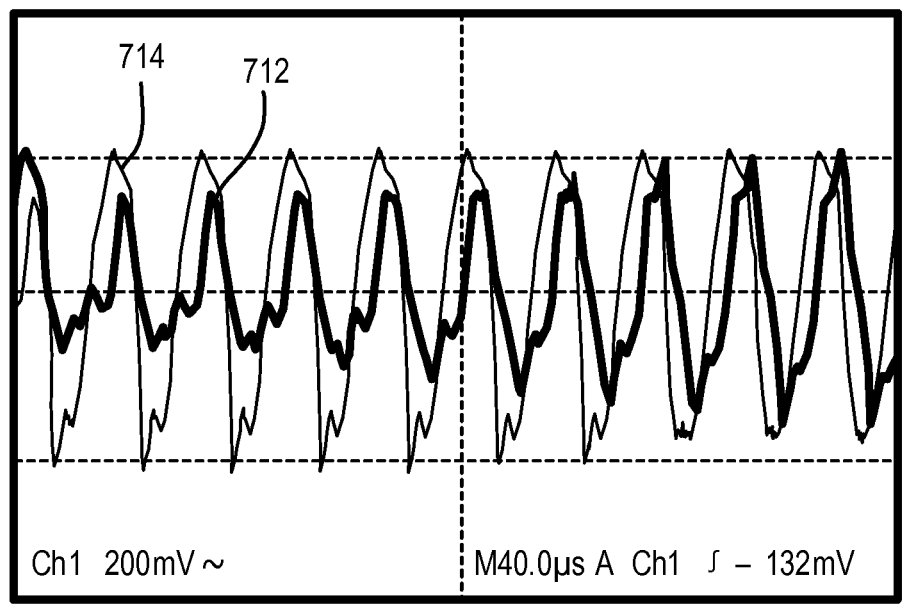
FIG. 7A is a plot of two interfering control signals.
Figure 7B:
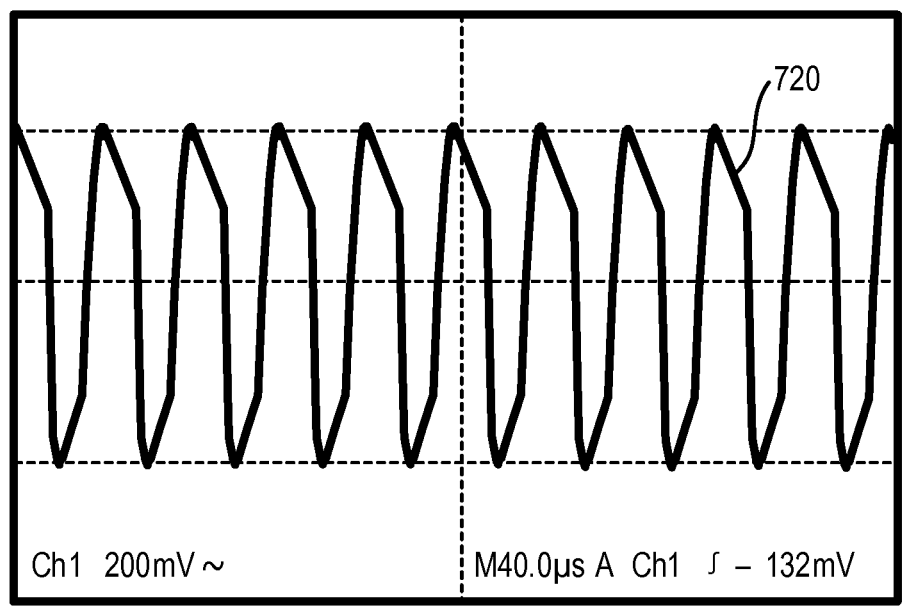
FIG. 7B is a plot illustrating a proper control signal form.

During normal operation, signals from the antennas 40a, 40b that are in communication with the ports 360-364 are communicated to the splitters 410 and the signals are split to each of the second port 414 and the third port 416. However, the switching splitters 410 may also be used to provide control signals from the SWM modules 42, 42' to the outdoor unit and the antennas 40a, 40b. The control signals may include a DC signal and an AC signal. In one constructed example, the AC signal is a 22 kHz signal. However, it was found that when both SWM modules 42, 42 provide the control signals, the signals interfere with each other. An example of interfering control signals is illustrated in FIG. 7A. As is illustrated, the first signals 712 and the second signals 714 communicated over the same line cause a disturbance in the signal. This may cause errors to occur at the outdoor unit or antennas 40a, 40b. In FIG. 7B, a control signal 720 is illustrated having correct waveform behavior. When contrasting FIGS. 7A and 7B, a significant difference is evident.

By joining the SWM modules 42 and 42' more unit configurations or receiving devices can be added to the system. By joining SWM modules, an antenna connection can be shared therebetween. An initial system capable of a limited number of unit configurations can be deployed to keep costs low such as shown in FIG. 3. As more subscribers are added, more SWM modules may be added together in the manner illustrated in FIG. 4. More than two SWM modules may be added together when more unit configurations are required.

It should be noted that the splitter modules 410, 320 and 330 may all have integrated connectors that are received through the outputs 370-384.

Figure 5:
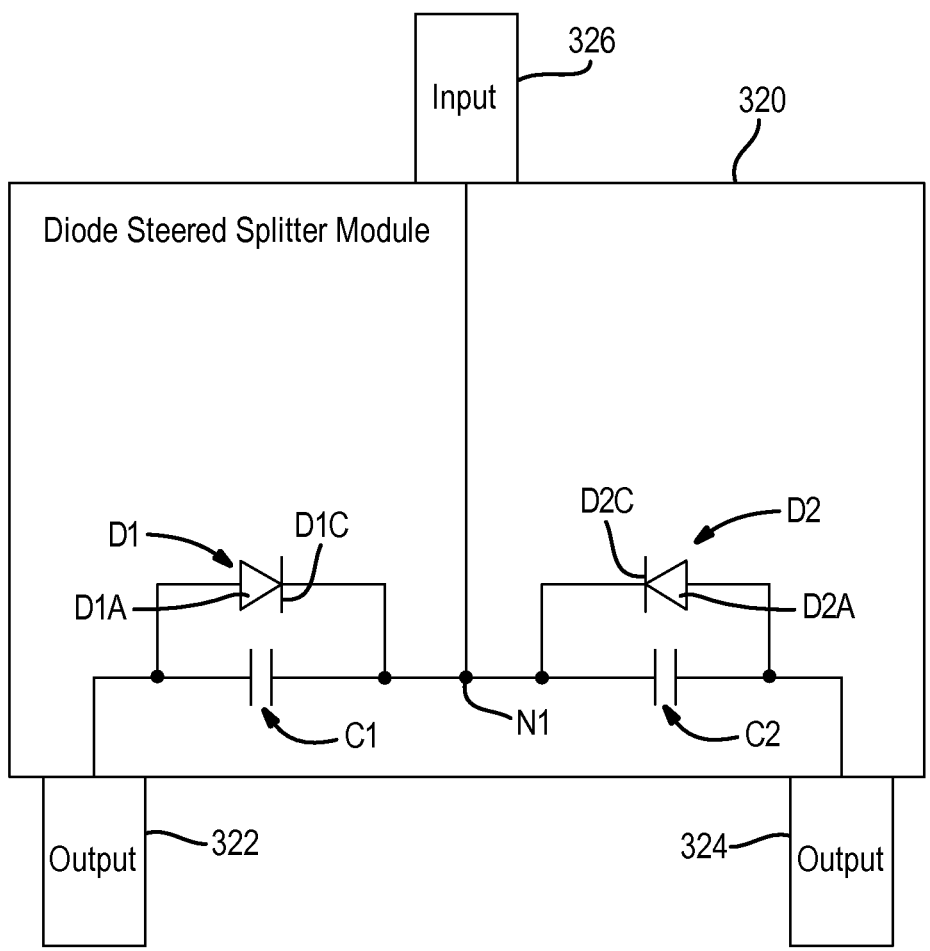
FIG. 5 is a block diagrammatic view of the steered diode splitter of FIGS. 3 and 4.

Referring now to FIG. 5, one example of a diode steered splitter module 320 is illustrated. Each of the diode steered splitters may be configured in a similar manner. In this example diode steered splitter module 320 includes the port 326 which is split into the port 322 and port 324. Internally, a common input node N1 associated with input 326 has a capacitor C1 between the node N1 and the port 322. A diode D1 having an anode D1A and a cathode D1C is in parallel with the capacitor C1. Further, a capacitor C2 is disposed between the node N1 and the port 324. A second diode D2 having a cathode D2C and an anode D2A is set forth. The anodes D2A, D1A and one end of the capacitors C1 and C2 are electronically coupled to the respective port 322, 324. Ports 322, 324 act as output nodes. Ports 322, 324 may represent connectors that are disposed through the outputs 370-384. The connectors may be threaded. The cathodes are electrically coupled to the node N1. In this manner, the highest voltage across the diodes allows the diode to conduct toward the input port 326. This in turn powers the SWM module.

Figure 6:
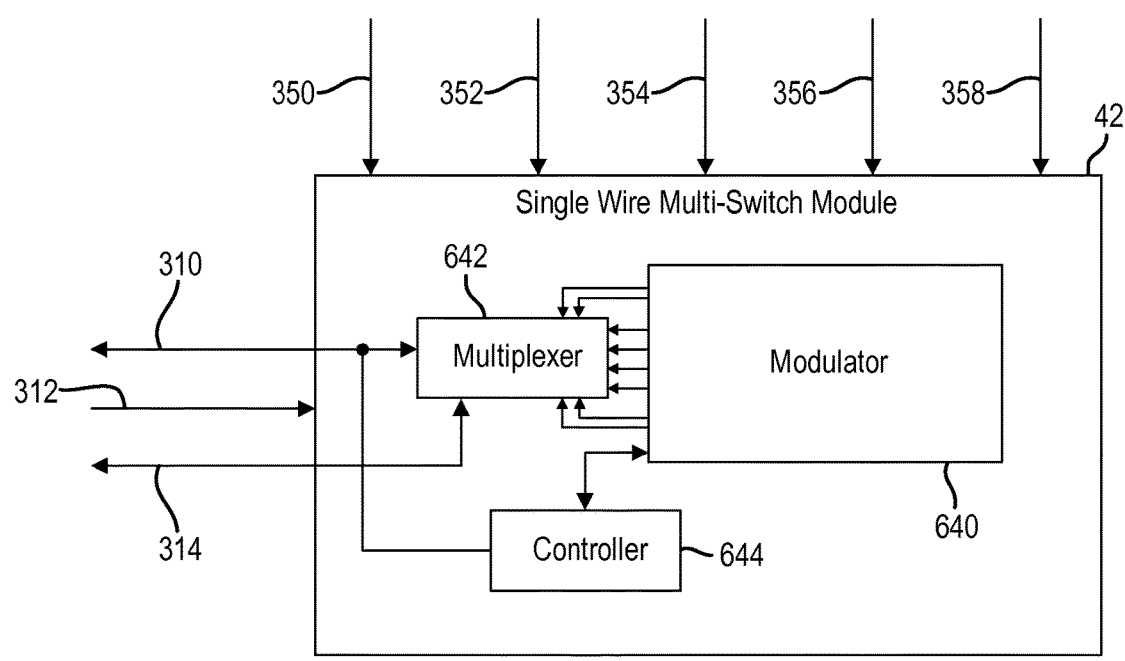
FIG. 6 is a block diagrammatic view of the single-wire multi-switch module illustrated in FIG. 1.

Referring now to FIG. 6, a single-wire multi-switch module of FIGS. 3 and 4 (switch module) 42 is illustrated in further detail. In this example, five inputs 350, 352, 354, 356 and 358 are illustrated. The single-wire multi-switch module 42 may also include output ports 310 and 314, as described above, that is used for generating an output that is communicated to the various units.

The inputs 350-358 may receive external channel signals having various frequencies and or polarizations corresponding to the transponders of the satellite. The inputs include frequencies that correspond to program guide data.

The inputs 350-358 correspond to the transponders for the different orbital locations of the satellite. The single-wire multi-switch module 42 assigns a frequency for each tuner module within the user receiving devices that desire a channel signal. Thus, each of the tuner modules is assigned a different frequency band for communication. A modulator module 640 is used for providing the modulated signals. Each of the user receiving devices thus generates a request for a channel from one of the inputs 350-358. The channels are then modulated into the frequency corresponding to the tuner of the user receiving device. The frequency signals may be combined onto the outputs 310-314 using a multiplexer 642. The splitter module 44 illustrated above splits the combined signal for each tuner or user receiving device. Every tuner may receive every requested channel but only the channel (frequency) corresponding thereto is displayed. A controller 644 controls the communication and the modulator modules 640 to provide the proper signal for the user device within the unit. Various numbers of devices and/or tuners may be provided depending upon the size of the single-wire multi-switch module. Program guide data may be communicated through the inputs 350-358.

Figure 8A:
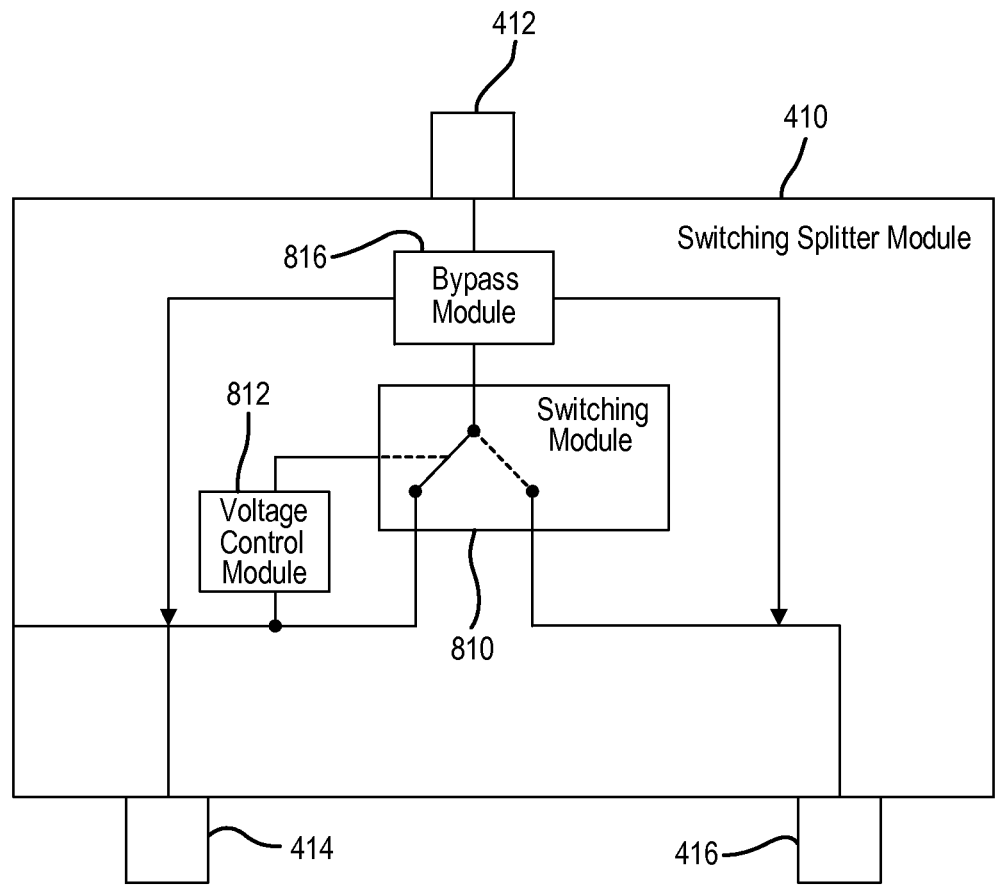
FIG. 8A is block diagrammatic view of a switching splitter according to the present disclosure.

Referring now to FIG. 8A, a switching splitter 410 is illustrated in further detail. The switching splitters 410 include a first port 412, a second port 414 and a third port 416. The first port 412 may be referred to as an input port. The second port 414 and the third port 416 may be referred to as an output port. A typical splitter splits the signal from port 412 into two signals that are provided at port 414 and port 416. The identical signal is from the input port 412 is provided to the port 414 and port 416. As mentioned above, control signals passing from port 414 and 416 to the port 412 may constructively interfere causing improper control signals.

The switching splitter 410 has a switching module 810 and a voltage control module 812 that is in communication with the switching module 810. The voltage control module 812 senses the direct current voltage from the port 414 and controls the switching module 810 in response thereto. The "sensor" may not be a separate component but rather a set point for switching a switch in the switching module 810. When the direct current voltage at the port 414 is above a voltage threshold such as a direct current voltage threshold, the output of the switching module 810 may be changed. In the present example, the predetermined threshold voltage is 10 volts. However, other voltages may be used as the predetermined threshold. When the DC voltage at the voltage control module 812 is above 10 volts, the switching module 810 passes the DC voltage and an AC control signal such as a 22 kHz control signal. When the voltage is greater than 10 volts, a second DC control signal and a second AC control signal are blocked from passing from the port 416 to the port 412 through the switching splitter module.

When the DC voltage is greater than the threshold voltage, which in this example is 10 volts, the switch module 810 blocks the signal from the port 414 from passing through to port 412. When the voltage is less than the threshold voltage, such as 10 volts, the switching module 810 switches to allow the AC control signal and the DC control signal to be communicated from the port 416 to the port 412 through the switching splitter module 410.

The outdoor unit 36 receives signals from the satellite and converts them to an intermediate frequency for communication through wires. The frequencies may range from about 2 MHz to about 2150 MHz. The satellite signals are communicated through the switching splitter module 410 to both port 414 and port 416. A bypass module 816 allows the high frequency signals (such as MHz) to pass from the port 412 to both the ports 414 and 416. The bypass module 816 may be incorporated directly in the switching module 810 or as a separate element. For that matter, the switching module 810, the bypass module 816 and the voltage control module 812 may all be incorporated in a single circuit package. The bypass module 816 may be a high pass filter that passes signal above 1 MHz but block signals below 1 MHz and D.C. signals. The switching module 810 may be a physical switch where a combination of discrete analog components comprising diodes and capacitors. The switching module 810 may comprise a transistor switch.

Figure 8B:
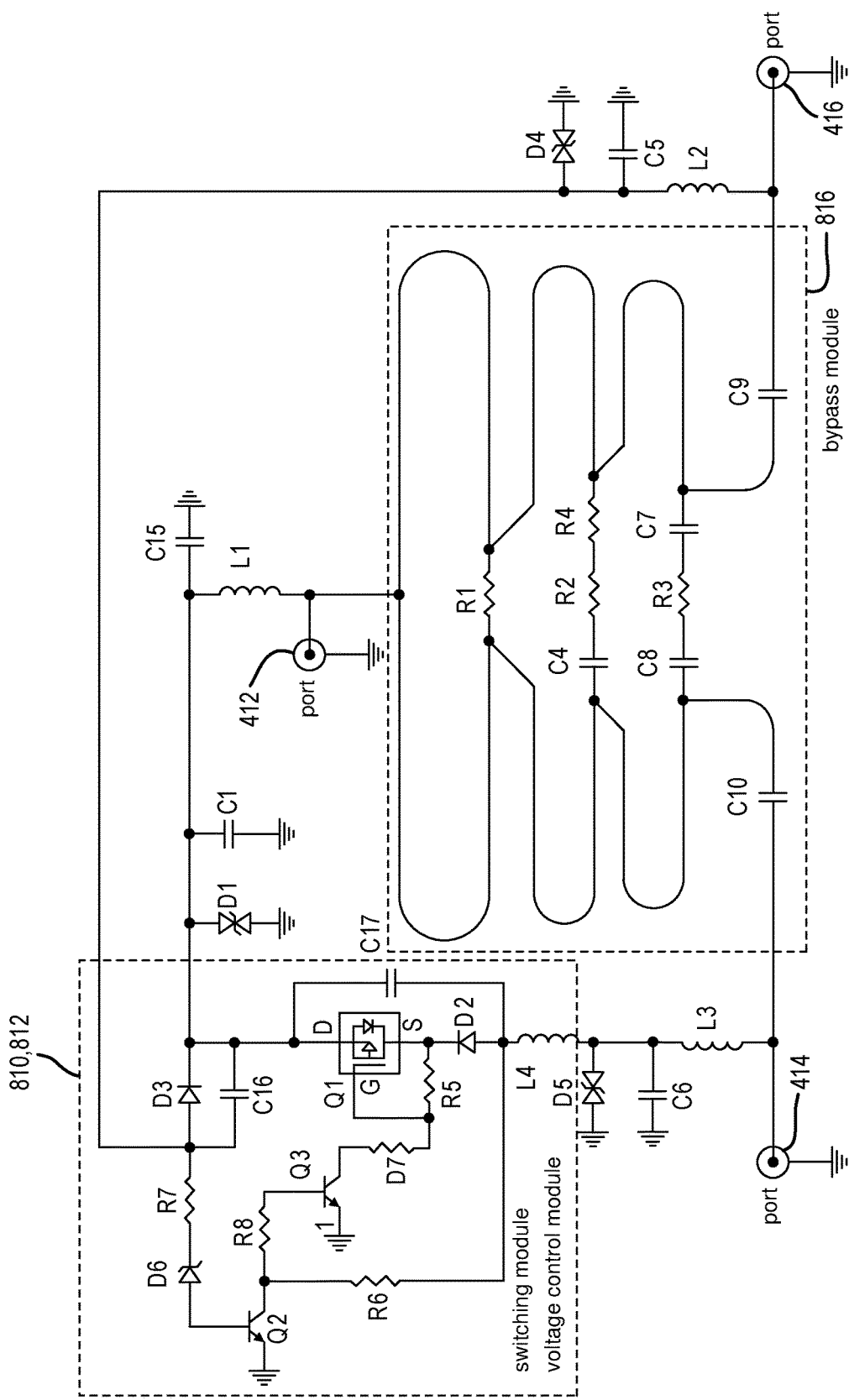
FIG. 8B is a detailed schematic view of the switching splitter.

Referring now to FIG. 8B, a schematic view of a detailed switching splitter 410 is set forth. In this example, the switching splitter includes the switching module 810/voltage control module 812 as described above and the bypass module 816. The bypass module 816 includes a plurality of components, such as a resistor R1 and parallel with the series combination of capacitor C4, R2 and R4 which in turn is in parallel with capacitors C8, R3 and C7. Capacitors C10 and C9 may be sized to allow a predetermined frequency to pass therethrough. That is, the capacitors C10 and C9 may allow high frequency signals to pass from port 412 to both ports 414 and 416 simultaneously and continuously. In this example, capacitors C9 and C10 allow signals greater than 1 MHz to pass therethrough.

Surge and lightning protection is provided by capacitors C1, C5, C6 and C15. Schottky diodes D1, D4 and D5. Inductors L1, L2, L3 and L4 also provide surge and lightning protection. Transistors Q2, Q3, diode D6 and resistor R7 all provide lightning and surge protection.

The switching module 810 includes a DC operated switch Q1. The DC operated switch Q1 has a source in communication with the cathode of the diode D2. The anode of the diode D2 is in communication with the second port 414 through the inductors L3 and L4. The switch Q1 is a DC operated MOSFET switch. In this configuration the voltage at the source S, controls the conduction and non-conduction of the switch. A suitable example of a switch is an AP2311 available from Diodes Incorporated. The switch Q1 is a single channel current-integrated high-side power switch. In this example, a DC voltage threshold of 10 volts is used. That is, conduction occurs when the DC voltage at the second port 414 is above 10 volts. Both DC and AC control signals are communicated through the switch Q1 to port 412. Then the switch Q1 does not have a voltage greater than 10 volts present at the source, the switch Q1 is non-conducting and therefore the AC and DC control signals from the port 416 is communicated through the diode D3 and to the port 412.

Capacitors C16 and C17 are provided to prevent clipping and thus smooth out the signal past to the port 412.

Figure 9:
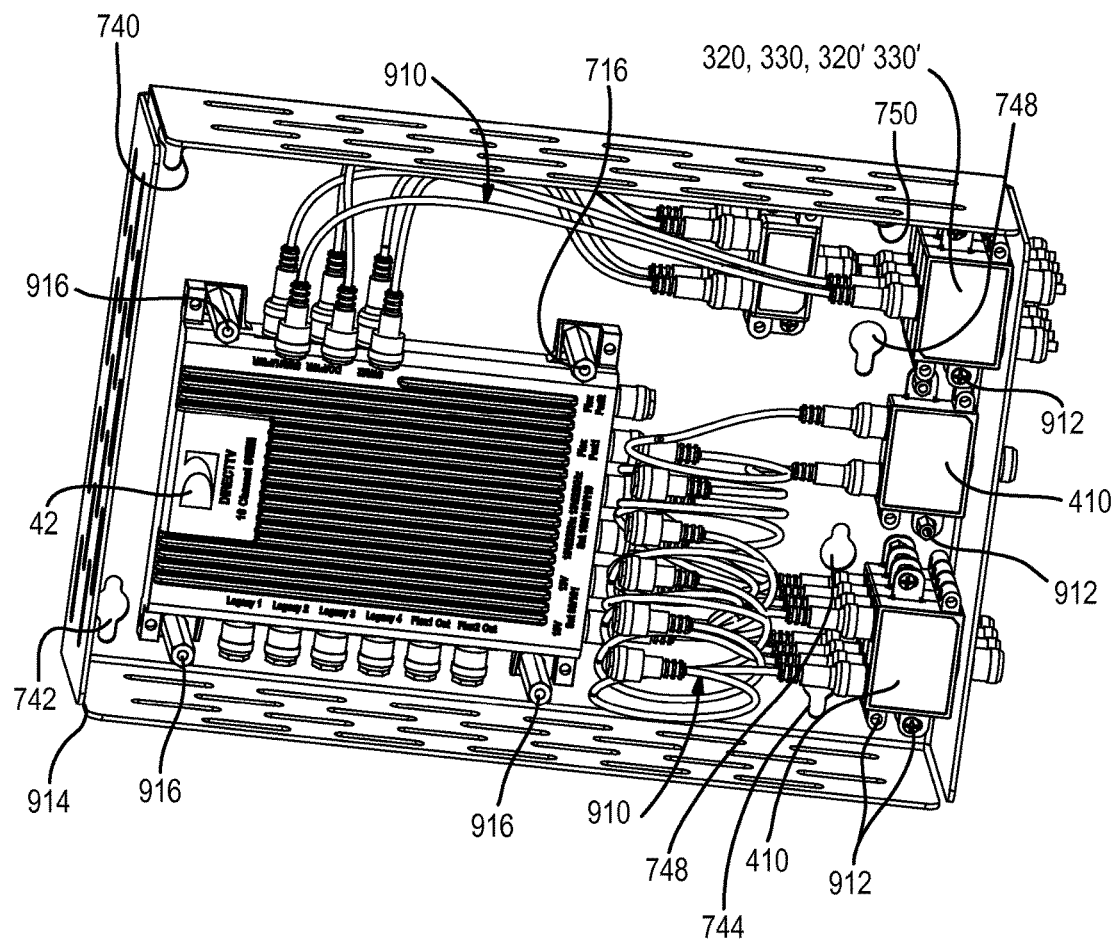
FIG. 9 is an interior view of the housing.

Referring now to FIG. 9, an interior view of a housing 914 is illustrated. The components from FIGS. 3 and 4 are labeled therein. That is, the SWM module 42 is illustrated relative to the switching splitters 410 and the diode steered splitter modules 320, 330, 320' and 330'. Various wires are used to interconnect the various components. The wires are generally illustrated as reference numeral 910. Various fasteners 912 are used to secure the splitter modules 410, 320, 330, 320' and 330', to the housing 914.

A plurality of extensions 916 may be used to secure the SWM module 42 to the housing 914.

Figure 10:
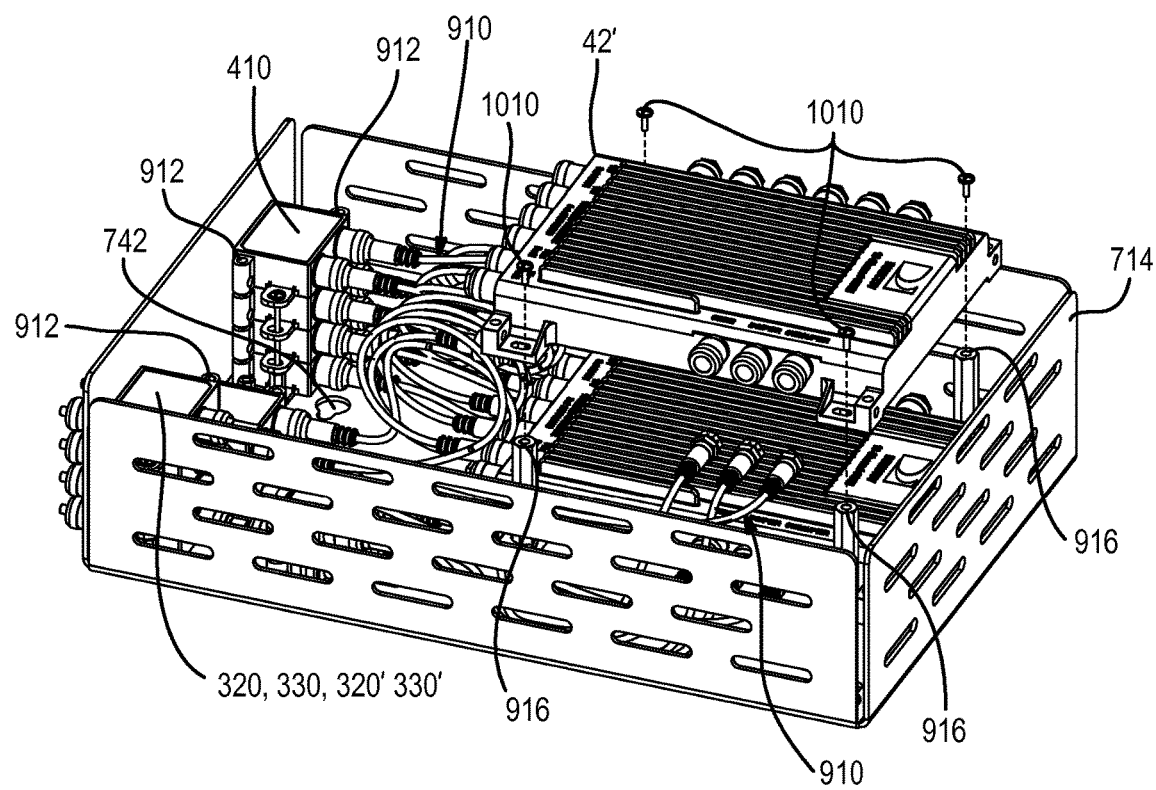
FIG. 10 is an interior view of a housing having dual SWM modules.

Referring now to FIG. 10, the housing 914 is shown with a second SWM module 42'. The SWM module 42' is physically mounted to the extensions 916 through the use of fasteners 1010. The fasteners 1010 may be screws.

Figure 11:
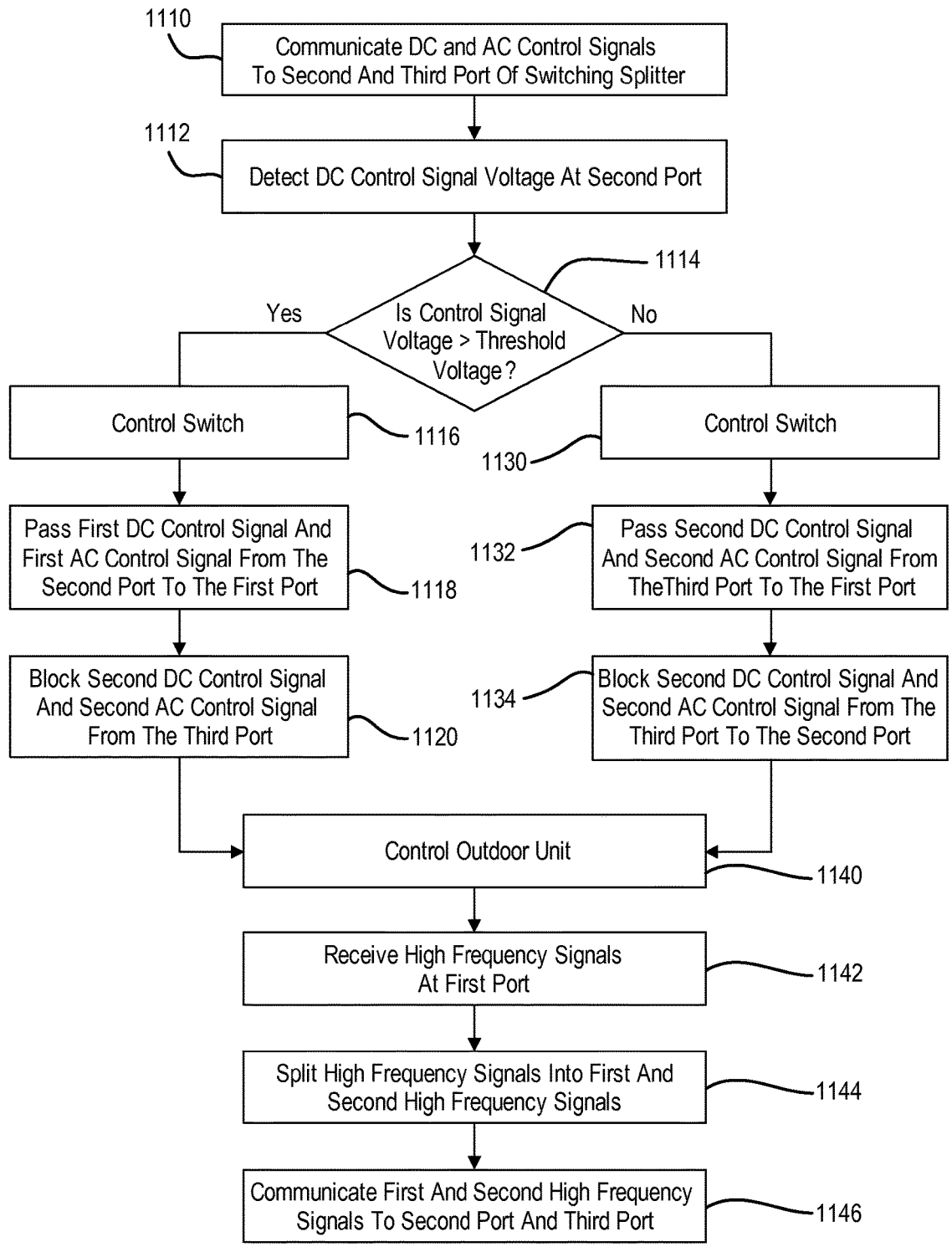
FIG. 11 is a flowchart of a method for operating a switching splitter according to the present disclosure

Referring now to FIG. 11, a method for operating the switching splitter 410 illustrated above is set forth. In step 1110, DC and AC control signals are communicated to the second port and third port of the switching splitters from respective SWM modules. For convenience, the second port receives a first DC control signal and a first AC control signal. The third port receives a second DC control signal and a second AC control signal. In step 1112, the DC control voltage signal at the second port is detected.

When the DC control signal voltage is greater than a threshold in step 1114, the switch is controlled in step 1116. In step 1118, the first DC control signal and the first AC control signal is communicated from the second port to the first portion through the switch. In step 1120, the second DC control signal and the second AC control signal is blocked from being communicated from the third port to the first portion.

Referring back to step 1114, when the DC control signal voltage is not greater than the threshold, the switch is controlled in step 1130. In step 1132, the control switch passes the second DC control signal and the second AC control signal from the third port to the first port. In step 1134, the first DC control signal and the first AC control signal are blocked from the second port to the first port. However, the switch configuration is such that when no control signals are present at the second port, the third port control signals are communicated to the first port. However, when the first port control signals are present, the AC and DC control signals are communicated to the first port. Thus, step 1114 may not be required to be performed when the SWM module associated with the first port is not communicating control signals.

The outdoor unit is controlled after steps 1120 and 1134 in step 1140. The outdoor unit and the low noise blocks therein may be controlled so that the television signals are communicated to the first port of the switching splitter. In step 1142, the high frequency signals are received at the first port. In step 1144, the high frequency signals received from the control unit are split into a first set of high frequency signals and a second set of high frequency signals. In step 1146, the first and second high frequency signals are communicated to the second port and the third port. As mentioned above, a high pass filter may be incorporated into the switching splitter to ensure that the signals are constantly communicated. The switch operation does not prevent the high frequency signals from being communicated from the first port to the second and third ports.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A switching splitter module comprising:
  a first port;
  a second port in communication with the first port, said second port receiving a first direct current control signal and a first alternating current control signal;
  a third port in communication with the first port, said third port receiving a second direct current control signal and a second alternating current control signal;
  a switching module in communication with the second port and the third port, said switching module switching when the first direct current control signal at the second port is greater than a first threshold, said switching module communicating the first direct current control signal and the first alternating current control signal from the second port to the first port and blocking the second direct current control signal and the second alternating control signal from being communicated from the third port to the first port, and when the first direct current at the second port is less than the first threshold, said switching module communicating the second direct current control signal and the second alternating current control signal from the third port to the first port and blocking the first direct current control signal and the first alternating control signal from being communicated from the second port to the first port; and
  a bypass module continuously communicating a first input signal from the first port to the second port and from the first port to the third port.

2. The splitter module as recited in claim 1 wherein the first input signal has a frequency greater than the first alternating current control signal or the second alternating current control signal.

3. A satellite television distribution system comprising:
  an outdoor unit communicating television signals to the first port;
  a first switching splitter module as recited in claim 1;
  wherein the second port is in communication with a first single-wire multi-switch module; and
  wherein the third port is in communication with a second single-wire multi-switch module.

4. The satellite distribution system as recited in claim 3 wherein a plurality of unit configurations are in communicating with the first single-wire multi-switch module and the second single-wire multi-switch module.

5. A method of operating a switching splitter module comprising a first port, a second port in selective communication with the first port and a third port in selective communication with the first port, said method comprising:
  receiving a first direct current control signal and a first alternating current control signal at the second port;
  receiving a second direct current control signal and a second alternating current control signal at the third port;
  when the first direct current control signal at the second port is greater than a first threshold, controlling a switching module to communicate the first direct current control signal and the first alternating current control signal from the second port to the first port and blocking the second direct current control signal and the second alternating control signal from being communicated from the third port to the first port;

when the first direct current at the second port is less than the first threshold, said controlling the switching module to communicate the second direct current control signal and the second alternating current control signal from the third port to the first port and blocking the first direct current control signal and the first alternating control signal from being communicated from the second port to the first port;

continually communicating an input signal from the first port to the third port and from the first port to the second port.

6. The method as recited in claim 5 wherein the first input signal has a frequency greater than the first alternating current control signal or the second alternating current control signal.

7. The method as recited in claim 5 further comprising communicating television signals from an outdoor unit to the first port.

8. The method as recited in claim 7 further comprising communicating the first control direct current control signal and the first alternating current control signal to the second port from a first single-wire multi-switch module.

9. The method as recited in claim 8 further comprising communicating the second direct current control signal and the second alternating current control signal to the third port with a second single-wire multi-switch module.

10. The method as recited 9 further communicating television signals from the first single-wire multi-switch module and the second single-wire multi-switch module to a plurality of unit configurations.

* * * * *